(12) United States Patent
Ishibashi et al.

(10) Patent No.: US 7,940,009 B2
(45) Date of Patent: May 10, 2011

(54) PLASMA PROCESSING APPARATUS

(75) Inventors: Kiyotaka Ishibashi, Amagasaki (JP);
Toshihisa Nozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 12/274,650

(22) Filed: Nov. 20, 2008

(65) Prior Publication Data
US 2009/0074632 A1 Mar. 19, 2009

Related U.S. Application Data

(63) Continuation of application No. 10/515,626, filed as application No. PCT/JP03/06901 on May 30, 2003, now Pat. No. 7,469,654.

(30) Foreign Application Priority Data

Jun. 6, 2002 (JP) .................................. 2002-165504

(51) Int. Cl.
*H01B 31/26* (2006.01)
*C23C 16/00* (2006.01)

(52) U.S. Cl. ............................. 315/111.21; 118/723 NA

(58) Field of Classification Search ............. 315/111.21, 315/111.31, 111.41, 111.71; 118/728, 733; 219/121.21, 121.28
See application file for complete search history.

(56) References Cited

U.S. PATENT DOCUMENTS

| 6,074,516 | A  | * | 6/2000 | Howald et al. ............ 156/345.24 |
| 6,320,321 | B2 | * | 11/2001 | Ogura et al. ............. 315/111.81 |
| 6,583,572 | B2 | * | 6/2003 | Veltrop et al. ........... 315/111.51 |
| 6,677,549 | B2 | * | 1/2004 | Suzuki et al. ............ 219/121.41 |
| 6,713,968 | B2 | * | 3/2004 | Ishii et al. ................ 315/111.21 |
| 6,729,261 | B2 |   | 5/2004 | Hongo |
| 6,797,112 | B2 |   | 9/2004 | Itabashi et al. |
| 6,864,640 | B2 | * | 3/2005 | Okumura et al. .......... 315/169.4 |
| 2002/0038791 | A1 |   | 4/2002 | Okumura et al. |
| 2003/0038791 | A1 |   | 2/2003 | Chou |

FOREIGN PATENT DOCUMENTS

| JP | 08-138889 | 5/1996 |
| JP | 09-139380 | 5/1997 |
| JP | 09-232099 | 9/1997 |
| JP | 10-214823 | 8/1998 |
| JP | 2000-030897 | 1/2000 |
| JP | 2000-243707 | 9/2000 |
| JP | 2000-357683 | 12/2000 |
| JP | 2001-223171 | 8/2001 |
| JP | 2001-274149 | 10/2001 |
| JP | 2002-016052 | 1/2002 |
| JP | 2003-059919 | 2/2003 |
| JP | 2003-082467 | 3/2003 |
| JP | 2003-151797 | 5/2003 |
| JP | 2003-168681 | 6/2003 |
| JP | 09-232099 | 9/2007 |

* cited by examiner

*Primary Examiner* — Douglas W Owens
*Assistant Examiner* — Minh D A
(74) *Attorney, Agent, or Firm* — Oblon, Spivak, McClelland, Maier & Neustadt, L.L.P.

(57) ABSTRACT

A plasma processing apparatus includes a chamber for carrying out plasma processing inside, a top plate made of a dielectric material for sealing the upper side of this chamber, and an antenna section that serves as a high frequency supply for supplying high frequency waves into the chamber via this top plate. The top plate is provided with reflecting members inside thereof. The sidewalls of the reflecting members work as wave reflector for reflecting high frequency waves that propagate inside the top plate in the radius direction. Alternatively, no reflecting members may be provided in a manner in which the sidewalls of a recess of the top plate serve as a wave reflector means.

10 Claims, 11 Drawing Sheets

US 7,940,009 B2

PLASMA PROCESSING APPARATUS

CROSS-REFERENCE TO RELATED APPLICATIONS

This application is a continuation of U.S. patent application Ser. No. 10/515,626 (now U.S. Pat. No. 7,469,654), which was filed on Dec. 6, 2004 as the U.S. national stage of International Application No. PCT/JP03/06901, filed May 30, 2003, the disclosures of which are incorporated herein by reference in their entireties. This application claims priority to Japanese Patent Application No. 2002-165504, filed Jun. 6, 2002, the disclosure of which is incorporated herein by reference in its entirety.

TECHNICAL FIELD

The present invention relates to a plasma processing apparatus for producing plasma in a chamber, on which a work piece is placed, and carrying out plasma processing on the work piece.

BACKGROUND ART

With reference to FIG. 21, the configuration of a conventional plasma processing apparatus will be described. This plasma processing apparatus includes a chamber 1 and also includes an antenna section 3 which covers the upper side of the chamber that opens, and serves as high frequency supply means. Antenna section 3 includes an antenna cover 3a made of aluminum alloy, a retardation plate 3b made of ceramics and an antenna plate 3c made of copper alloy. Antenna plate 3c is provided with slots 20 which are a plurality of long through holes. In addition, a top plate 15 made of a dielectric material such as, for example, quartz or ceramics is placed between antenna section 3 and chamber 1. Here, the "top plate" is referred to as "dielectric window," "microwave transmitting window" or the like in some cases. Top plate 15 is secured to chamber 1 by a top plate presser ring 16. Antenna section 3 is secured by an antenna section retainer ring 17.

A susceptor 7 is placed in chamber 1 and, when plasma processing is carried out, exhausting the inside of chamber 1 by means of a vacuum pump 9 and a reactive gas is introduced from a gas inlet (not shown) after a substrate 11 that is to be processed is placed on the upper surface of susceptor 7. High frequency waves are generated by a high frequency generator 5. These high frequency waves are transmitted to antenna section 3 through a waveguide 6, passes through retardation plate 3b, is distributed in a constant range by means of the plurality of slots 20 in antenna plate 3c, and is supplied toward chamber 1. The high frequency waves pass through top plate 15 and convert the reactive gas into plasma. As a result of this, plasma 13 is produced in chamber 1 and plasma processing is carried out on substrate 11. Here, although waveguide 6 is a coaxial formed of an inner side conductor 6a and an outer side conductor 6b in this example, there may be waveguides in other forms.

In the state where the density of plasma 13 that has been produced in chamber 1 is increased to the degree where the cut-off frequency by the plasma becomes higher than the high frequency waves, the higher the density of the plasma is the greater the ratio of reflection of the high frequency waves from the interface between top plate 15 and plasma 13 becomes at the time when the high frequency waves are supplied into chamber 1. In the case where top plate 15 is thinner than a certain degree, the high frequency waves that have been reflected from the interface returns to high frequency generator 5 along waveguide 6 from top plate 15 and is again reflected toward antenna section 3 from a matching unit (not shown) which is generally placed between antenna section 3 and high frequency generator 5. As a result of this, the electric magnetic field becomes very strong in waveguide 6 between antenna section 3 and the matching unit, causing an abnormal discharge and a power loss.

On the other hand, in the case where top plate 15 is thicker than a certain degree, the reflected high frequency waves do not return along waveguide 6 but rather, tends to repeat the reflections from the outer surface of top plate 15 so as to be confined within top plate 15 forming standing waves. In the case where such standing waves occur, as shown in FIG. 22, intense electric field regions 18 locally appear within top plate 15 as viewed in the radius direction of top plate 15. Here, FIG. 22 shows only the left half. The arrows in FIG. 22 indicate the directions of propagation of the high frequency waves. In this case, the stronger electrical fields are generated in the vicinity of the center of top plate 15. As a result of this, such effects are reflected within chamber 1. FIG. 23 shows the plasma density distribution within chamber 1 at this time. That is to say, the plasma density is high in the vicinity of the center within chamber 1, impairing the uniformity of the plasma density. In the case where the uniformity of the plasma is impaired, the uniformity of plasma processing is also impaired.

In addition, the smaller the distance between slots 20 and plasma 13 is, that is to say, the thinner the top plate 15 is, the stronger the electrical field generated in the vicinity of the surface of plasma 13 by the electrical field formed in slots 20 becomes. In other words, the efficiency of power supply to the plasma is increased. Though this is preferable, top plate 15 is made of a dielectric material and a material such as quartz or ceramics is actually used; therefore, weakness in the physical strength becomes a problem limiting the reduction of the thickness of the top plate. In the case where quartz is used for the top plate in a plasma processing apparatus for carrying out plasma processing on a semiconductor wafer having a diameter of 300 mm, for example, the thickness of the top plate must be at least 40 mm from the point of view of ensuring the physical strength and such a thickness easily allows standing waves to occur inside the top plate. Undesired standing waves occurring inside the top plate reduces the efficiency of power supply, impairs the uniformity of the plasma density within the chamber and impairs the uniformity of plasma processing.

DISCLOSURE OF THE INVENTION

An object of the present invention is to provide a plasma processing apparatus that can enhance the uniformity of the plasma density without generating an abnormal discharge or undesired standing waves.

In order to achieve the above object, a plasma processing apparatus according to one aspect of the present invention includes: a chamber for carrying out plasma processing inside; a top plate made of a dielectric material for sealing the upper side of the chamber; and high frequency supplying means for supplying high frequency waves into the chamber via the top plate, wherein the top plate has wave reflecting means inside for reflecting high frequency waves that propagate inside the top plate. By adopting such a configuration, undesired propagation of high frequency waves inside the top plate can be prevented, providing an electromagnetic state that is preferable within the top plate.

In the above invention, preferably, the wave reflecting means is provided in order to reflect high frequency waves that propagate in the radius direction of the top plate. By adopting such a configuration, propagation of high frequency waves in the radius direction can be prevented, correcting maldistribution of the intensity of the electrical field within the top plate which is generated between the center portion and the outer peripheral portion.

In the above invention, preferably, the wave reflecting means is placed at approximately the center of the top plate. By adopting such a configuration, a portion of the electrical field having a high intensity can be prevented from being generated at the center of the top plate, making the distribution of the plasma density more uniform within the chamber.

In the above invention, preferably, the wave reflecting means divides the top plate. By adopting such a configuration, high frequency waves that propagate inside the top plate can be prevented from crossing over the respective divided regions, providing a stable electromagnetic state in each region and therefore, it becomes easier to control the energy stored in each region within the top plate.

In the above invention, preferably, an antenna plate having slots is provided between the top plate and the high frequency supplying means so that each of the slots is positioned within each region of the top plate divided by the wave reflecting means. By adopting such a configuration, it becomes possible to control the intensity of the electric field in each divided region by supplying high frequency waves individually through a slot and, therefore, the energy stored in each region within the top plate can be controlled without fail.

In the above invention, preferably, the top plate has a recess provided on at least one surface from among the front and rear surfaces so that the wave reflecting means is a sidewall portion of the recess. By adopting such a configuration, the wave reflecting means can be implemented in a simple structure without an increase in the number of parts.

In the above invention, preferably, the recess is in ring form. By adopting such a configuration, propagation of waves in the radius direction can be efficiently prevented.

In the above invention, preferably, the recess is provided on the side of the top plate that faces the high frequency supplying means. By adopting such a configuration, the wave reflecting means can be placed while maintaining the plasma generating plane at the same level as in the prior art.

In the above invention, preferably, the recess is provided on the side of the top plate that faces the chamber. By adopting such a configuration, plasma can be introduced inside the recess thus reducing the distance between the plasma generating plane and the antenna section and as a result, the efficiency of power supply to the plasma can be increased.

In the above invention, preferably, the wave reflecting means is the plasma that has entered into the recess. By adopting such a configuration, the wave reflecting means can be implemented by the plasma itself without providing any particular member in the top plate.

In the above invention, preferably, a reflecting member made of a material different from that of the top plate is placed inside the top plate so that the sidewall of the reflecting member is provided as the wave reflecting means. By adopting such a configuration, waves can be reflected from a predetermined position without fail by means of the reflecting member.

In the above invention, preferably, the length of a portion of the top plate located between the wave reflecting means which are adjacent to each other is no less than ½ of the wavelength of the high frequency waves when propagating through the material of the top plate. By adopting such a configuration, strong standing waves can be generated in a portion located between the wave reflecting means and thereby a strong electrical field can be generated in the vicinity of the plasma within the chamber. Accordingly, the power can be supplied more efficiently to the plasma.

In the above invention, preferably, the thickness of the top plate in the portion of the recess is no greater than ½ of the wavelength of the high frequency waves when propagating through the material of the top plate. By adopting such a configuration, standing waves can be prevented from occurring in a portion where the top plate becomes thin due to the existence of a recess. Accordingly, it becomes possible to independently control a separate situation where standing waves occur between adjacent regions which are divided by a recess.

In the above invention, preferably, the thickness of the top plate in the portion of the recess is no greater than ¼ of the wavelength of the high frequency waves when propagating through the material of the top plate. By adopting such a configuration, standing waves can be prevented without fail from occurring in a portion where the top plate becomes thin due to the existence of a recess.

In order to achieve the above object, a plasma processing apparatus according to another aspect of the present invention includes a chamber for carrying out plasma processing inside, a top plate made of a dielectric material for sealing the upper side of the chamber, high frequency supplying means for supplying high frequency waves into the chamber via the top plate, and an antenna plate having a slot provided between the top plate and the high frequency supplying means, wherein the top plate has a thick portion and a thin portion so that the slot is placed in a position that corresponds to the thin portion. By adopting such a configuration, the strength of the top plate can be maintained by the thick portion and the thick portion serves as the wave reflecting means while the thin portion can reduce the distance between the slot and the plasma generating plane so as to increase the efficiency of power supply to the plasma and so as to prevent standing waves from occurring within the top plate and therefore, it becomes possible to implement a desired plasma distribution within the chamber.

BEST MODES FOR CARRYING OUT THE INVENTION

Embodiment 1

(Configuration)

Figure 1:
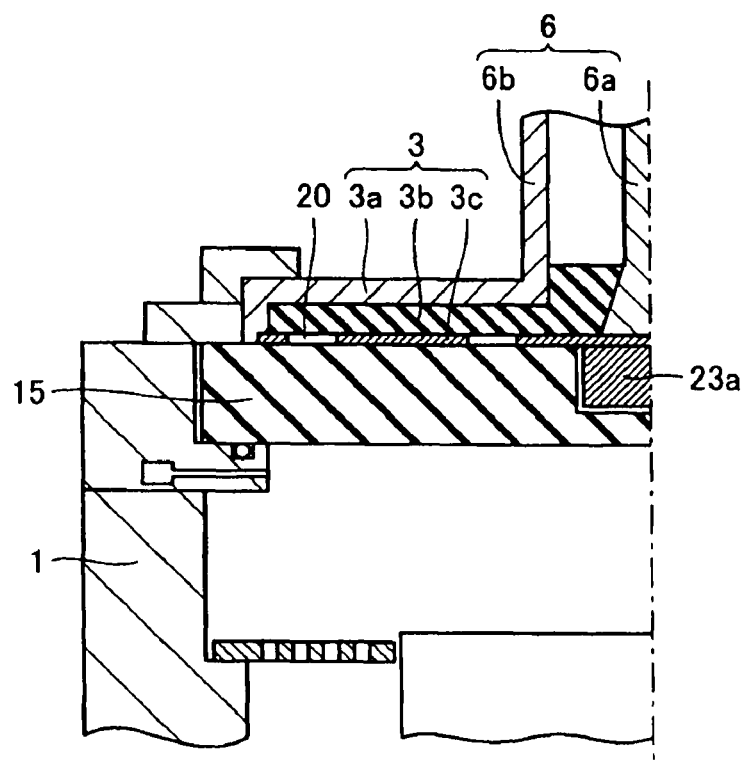
FIG. 1 is a cross sectional view of a portion of a plasma processing apparatus according to Embodiment 1 of the present invention.

With reference to FIG. 1, a plasma processing apparatus according to Embodiment 1 of the present invention will be described. FIG. 1 shows only the major portion of this plasma processing apparatus. The right half of the portions which are approximately symmetrical between the left and right sides is omitted so that only the left half is illustrated. In this plasma processing apparatus, a reflecting member 23a is buried in the center portion of a top plate 15. Reflecting member 23a is made of a conductor or a high dielectric material. Top plate 15 has a recess formed by digging the surface on the side facing an antenna section 3 (upper side in the figure). Reflecting member 23a is in a form which approximately fills in the inside space of this recess, and is installed in the condition of being contained within this recess. Reflecting member 23a may be fixed to a side of top plate 15 or may be fixed to a side of antenna section 3. Reflecting member 23a is placed so that the sidewalls thereof can be utilized as wave reflecting means.

(Working Effects)

Figure 2:
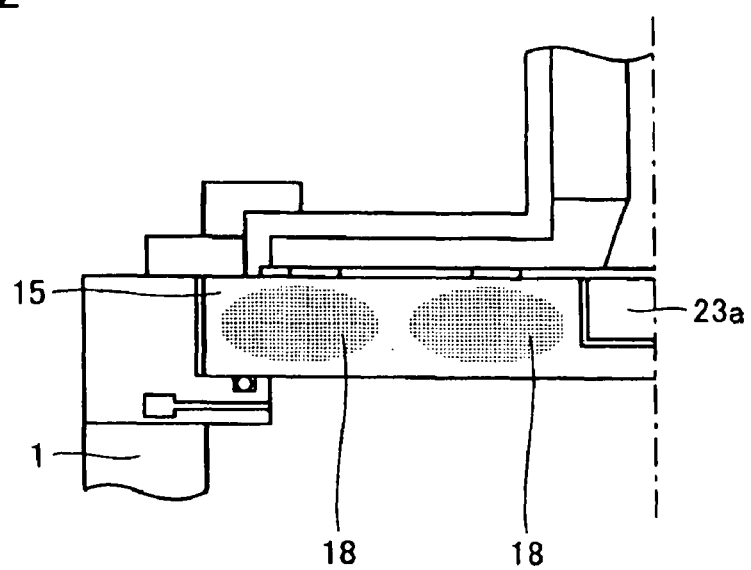
FIG. 2 is a view illustrating the distribution of the intensity of the electrical field inside the top plate of the plasma processing apparatus according to Embodiment 1 of the present invention.
Figure 22:
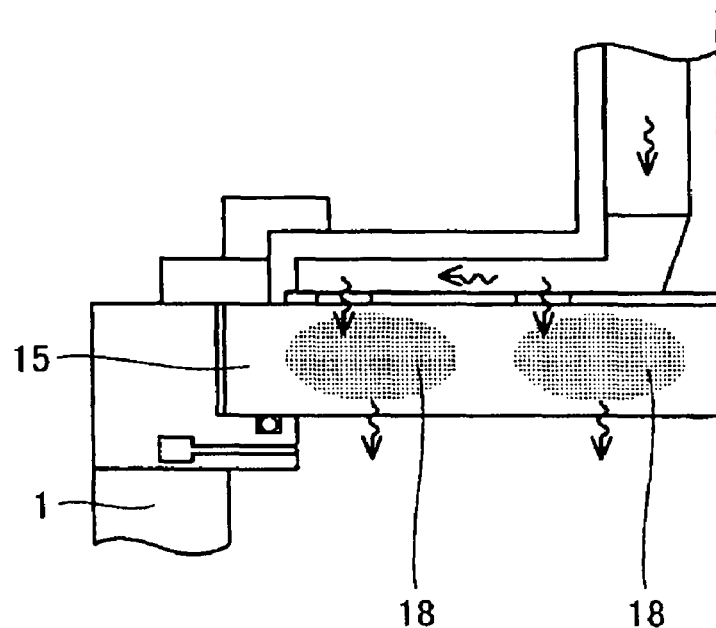
FIG. 22 is a view illustrating the distribution of the intensity of the electrical field inside the top plate of the plasma processing apparatus according to the prior art.

FIG. 2 shows the distribution of the intensity of the electrical field within top plate 15 in the case where standing waves have occurred in this plasma processing apparatus. Regions 18 of intense electrical fields are similar to those in an example of the prior art (see FIG. 22) with respect to the point where they locally appear as viewed in the radius direction of top plate 15, whereas regions 18 of intense electrical fields have occurred closer to the outer periphery than those in the example of the prior art by the amount of reflecting member 23a, which is placed in the center portion of top plate 15. It is considered that this is caused by preventing the high frequency waves which propagate inside top plate 15 in the radius direction from concentrating at the center of top plate 15 by means of the reflection of the high frequency waves from the sidewalls of reflecting member 23a.

Figure 3:
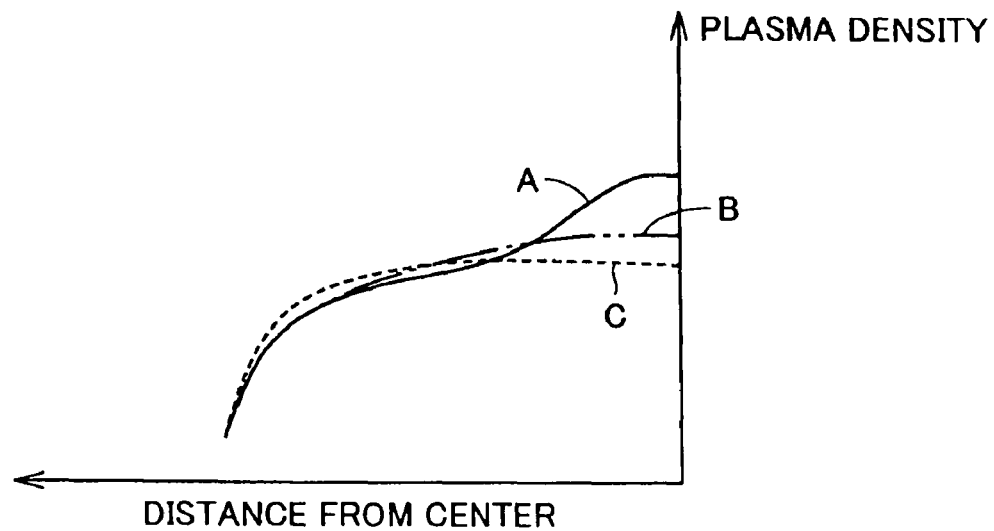
FIG. 3 is a graph showing the distribution of the plasma density within the chamber of the plasma processing apparatus according to Embodiments 1 and 2 of the present invention.
Figure 23:
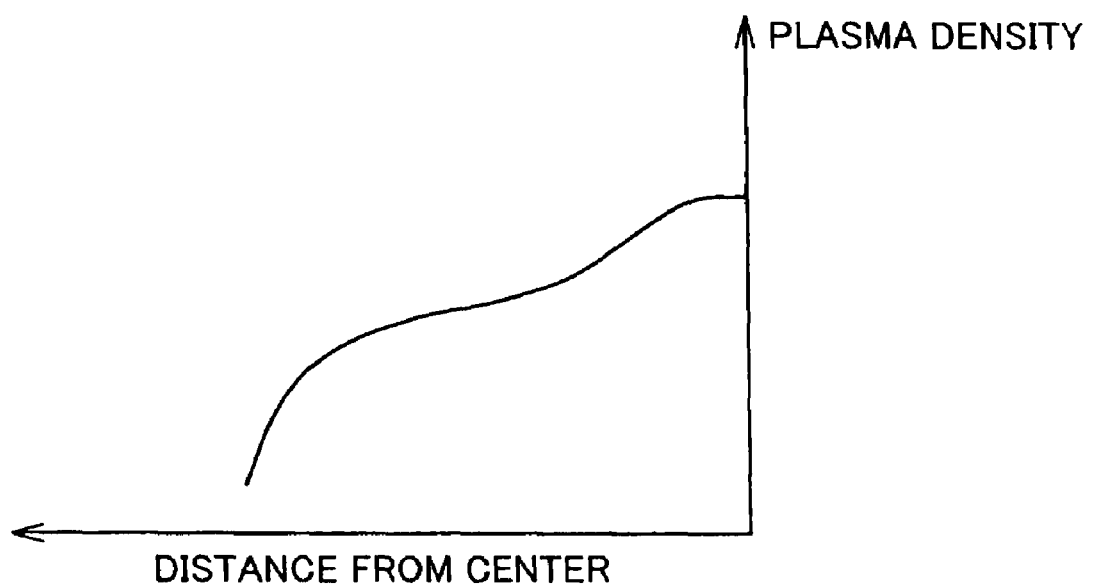
FIG. 23 is a graph showing the distribution of the plasma density within the chamber of the plasma processing apparatus according to the prior art.

Regions 18 of intense electrical fields within top plate 15 can provide more intense electromagnetic waves toward the plasma in portions directly beneath regions 18 of intense electrical fields than toward the rest of the space within the chamber, thus enhancing the plasma density in these portions. Accordingly, the plasma density at the center of the space within the chamber is lowered as a result of the shift in the positions of regions 18 of intense electrical fields within top plate 15 toward the outer periphery of top plate 15, and then, the distribution of the plasma density within chamber 1 becomes uniform in comparison with the prior art, as shown by curve B in FIG. 3. For the purpose of comparison, FIG. 3 shows the distribution of the plasma density within the chamber in the plasma processing apparatus without a reflecting member according to the prior art as curve A. Curve A is the same as that shown in FIG. 23.

Embodiment 2

(Configuration)

Figure 4:
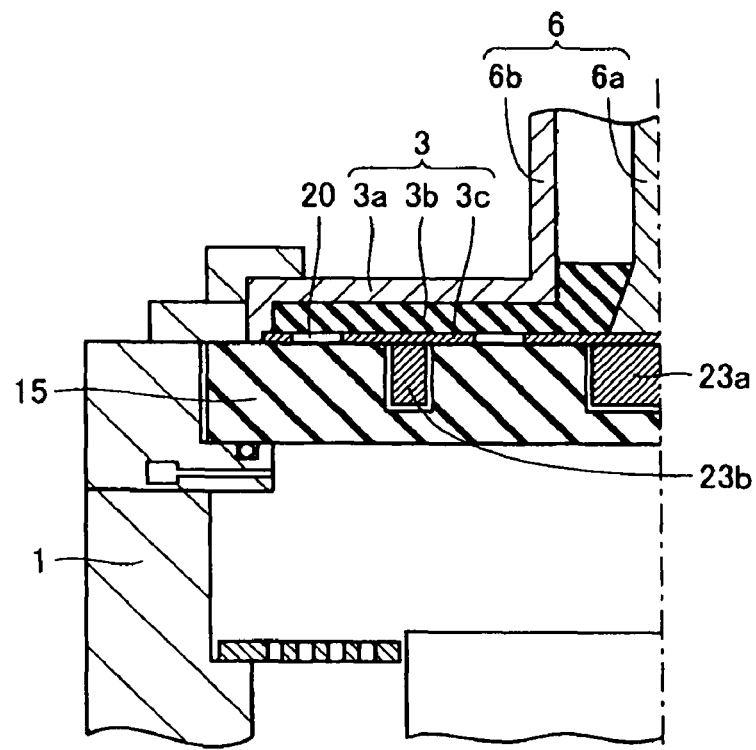
FIG. 4 is a cross sectional view of a portion of a first plasma processing apparatus according to Embodiment 2 of the present invention.

With reference to FIG. 4, a plasma processing apparatus according to Embodiment 2 of the present invention will be described. In this plasma processing apparatus, reflecting member 23a is buried in the center portion of top plate 15 in the same manner as the plasma processing apparatus according to Embodiment 1. In Embodiment 2, in addition to this reflecting member 23a in the center portion, a reflecting member 23b is placed in annular form so as to surround reflecting member 23a. Reflecting member 23b is also placed so that the sidewalls thereof can be utilized as wave reflecting means in the same manner as reflecting member 23a.

(Working Effects)

Figure 5:
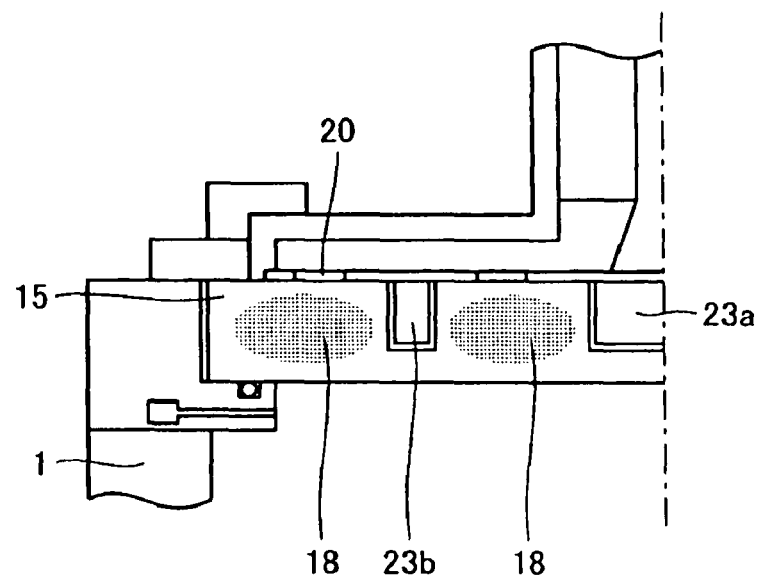
FIG. 5 is a view illustrating the distribution of the intensity of the electrical field inside the top plate of the first plasma processing apparatus according to Embodiment 2 of the present invention.

FIG. 5 shows the distribution of the intensity of the electrical field within top plate 15 in the case where standing waves have occurred in this plasma processing apparatus. Reflecting member 23b in annular form is also placed within this top plate 15 in addition to reflecting member 23a, thus providing the formation where top plate 15 is, so to speak, divided into concentric forms, and therefore, the positions that allow the occurrence of regions 18 of intense electrical fields are further limited, in comparison with Embodiment 1 (see FIG. 2). Regions 18 of intense electrical fields occur within the regions which are divided by reflecting members 23a and 23b. The reflecting members are placed so as to isolate the regions of top plate 15 which are divided into concentric forms from each other, and thereby, the high frequency waves that propagate inside top plate 15 in the radius direction are prevented from crossing over the respective regions. Accordingly, it becomes easier to independently control the energy of high frequency waves stored in each position within top plate 15. FIG. 3 shows the distribution of the plasma density within chamber 1 in this plasma processing apparatus as curve C. As is seen from FIG. 3, the distribution of the plasma density within chamber 1 becomes more uniform than the result (shown as curve B) of Embodiment 1.

Figure 6:
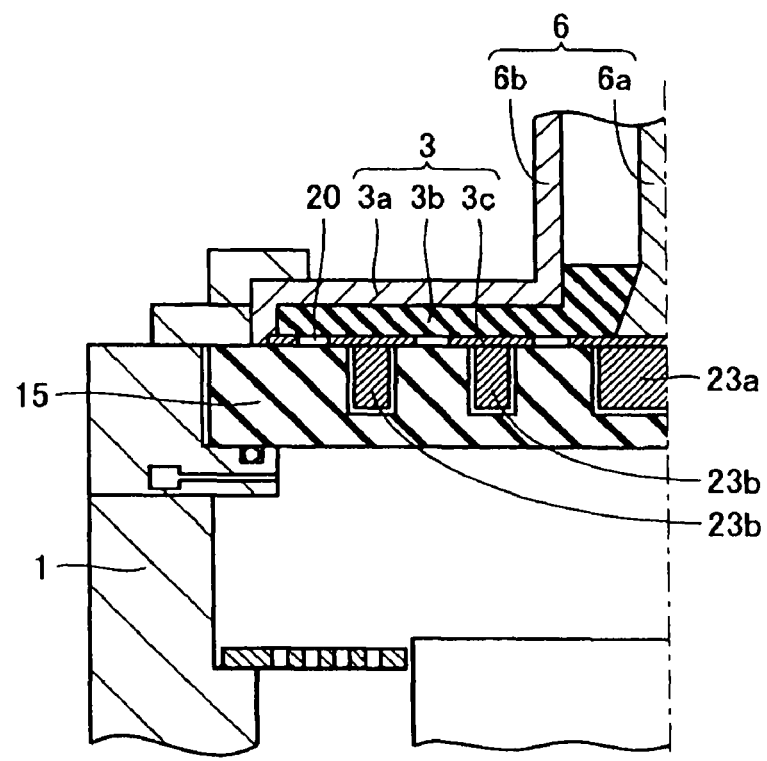
FIG. 6 is a cross sectional view of a portion of a second plasma processing apparatus according to Embodiment 2 of the present invention.

Though two reflecting members 23*a* and 23*b* are herein shown as reflecting members, the top plate may be divided into multiple concentric forms by a greater number of reflecting members, as shown in FIG. 6. It becomes possible to control the energy of high frequency waves stored in each position within top plate 15 more precisely by dividing the top plate into a greater number of regions.

In the plasma processing apparatus of the present embodiment, as shown in FIG. 4, slots 20 in antenna plate 3*c* are located in the positions which respectively correspond to the divided regions of top plate 15. The high frequency waves that move toward the sides from among the high frequency waves radiated toward the inside of the top plate from the slots are reflected from the sidewalls of the reflecting members as a result of the above-described arrangement of the slots, and thereby, the high frequency waves are confined within each of the divided regions, exhibiting downward directivity within each region. It becomes possible for each of the divided regions to be supplied with high frequency waves which are directed into the chamber from the individual slots through the top plate, and therefore the distribution of the plasma within the chamber can be controlled by appropriately modifying the forms and dimensions of the slots. Accordingly, this embodiment is preferable for uniformly supplying high frequency waves within the chamber.

Figure 7:
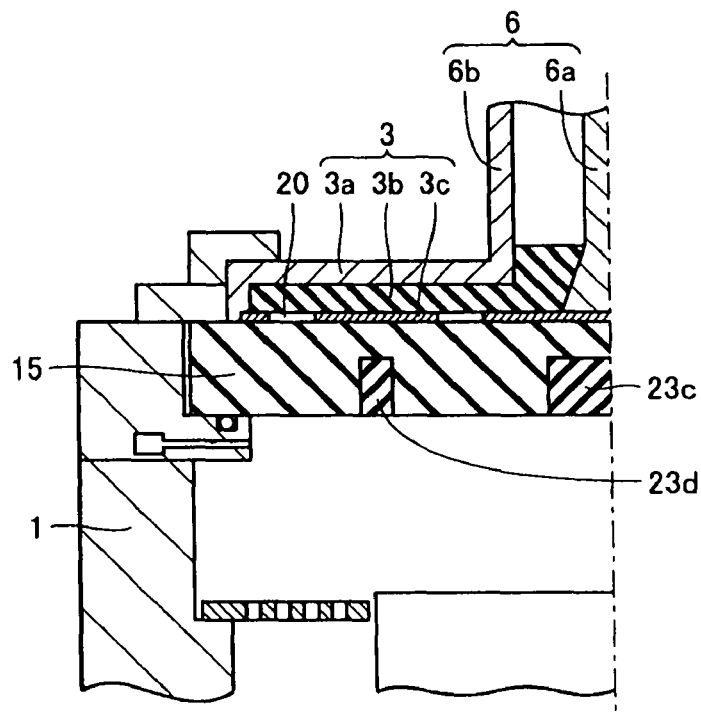
FIG. 7 is a cross sectional view of a portion of a third plasma processing apparatus according to Embodiment 2 of the present invention.
Figure 8:
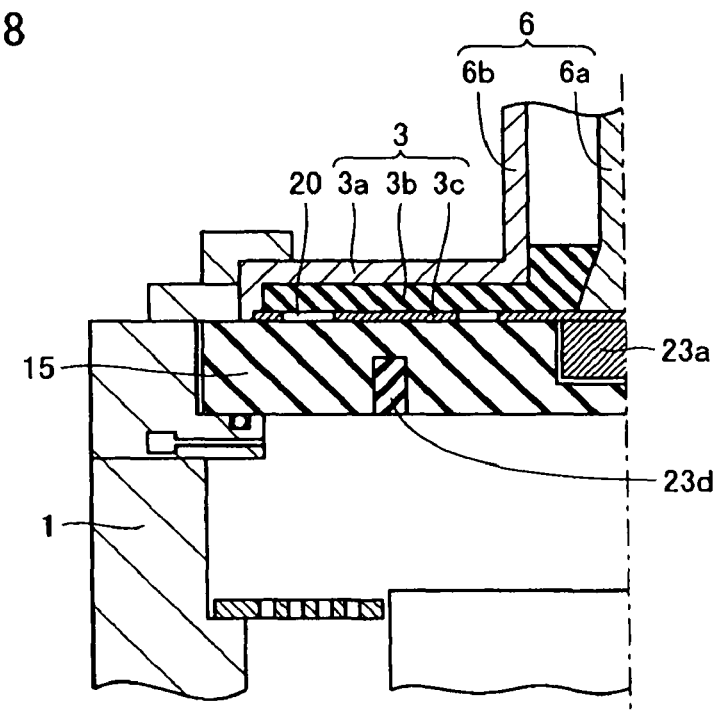
FIG. 8 is a cross sectional view of a portion of a fourth plasma processing apparatus according to Embodiment 2 of the present invention.
Figure 9:
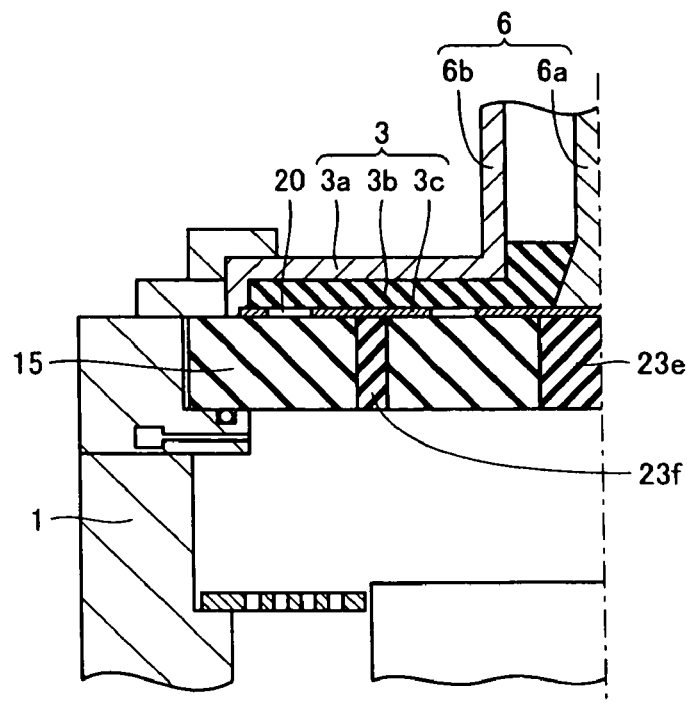
FIG. 9 is a cross sectional view of a portion of a fifth plasma processing apparatus according to Embodiment 2 of the present invention.
Figure 10:
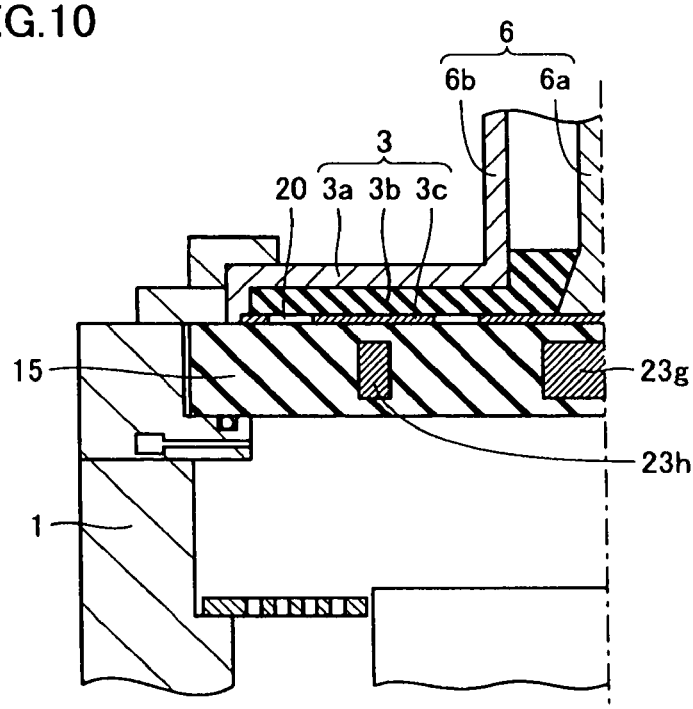
FIG. 10 is a cross sectional view of a portion of a sixth plasma processing apparatus according to Embodiment 2 of the present invention.

Though the plasma processing apparatus of Embodiments 1 and 2 has a structure where a recess or recesses are provided on the high frequency supplying means side of top plate 15, that is to say, on a side of antenna section 3, so that reflecting members are embedded in these recesses as wave reflecting means, it is not necessary for the members that correspond to the reflective members to be solid, but rather, the reflective members may be gas or liquid, as long as they are conductors or high dielectric materials. In such a case, the sidewalls of the recesses function as wave reflecting means. In addition, the provision of recesses is not limited to the high frequency supplying means side, but rather, recesses may be provided on the side facing chamber 1, as shown in FIG. 7. In the example shown in FIG. 7, reflective members 23*c* and 23*d* are placed inside such recesses. Recesses on each of the two sides may be appropriately combined, as shown in FIG. 8. Reflecting members 23*a* and 23*b* are placed as in the example shown in FIG. 8. Alternatively, reflecting members which serve as wave reflecting means may penetrate the top plate, as shown in FIG. 9, instead of being placed in recesses. Reflecting members 23*e* and 23*f* are placed as in the example shown in FIG. 9. Alternatively, a structure may be provided, as shown in FIG. 10, where reflecting members are completely buried inside top plate 15. Reflecting members 23*g* and 23*h* are placed as in the example shown in FIG. 10.

Here, in the case where reflecting members are made of metal, exposure of the reflecting members to the space within chamber 1, as in the structures shown in FIGS. 7 to 9, may cause a contamination within chamber 1, and therefore, it is necessary for the reflecting members to be covered, as viewed from the chamber 1 side, as in the structures shown in FIGS. 1, 4, 6 and 10.

Here, though some patterns of the arrangements of the reflecting members provide the arrangements of the reflecting members inside recesses or through holes which are provided on the surface and through the entire thickness of the top plate, as shown in FIGS. 1, 4 and 6 to 10, any recesses and through holes including these are regarded as being placed "inside the top plate" in the present specification.

Figure 11:
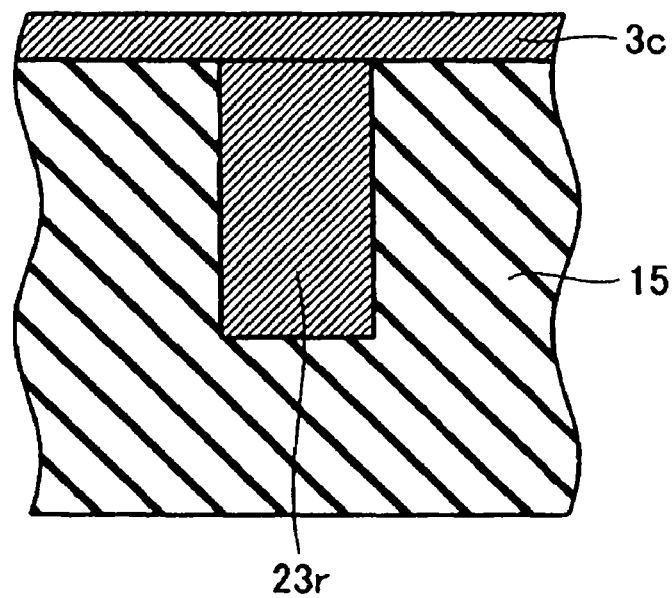
FIG. 11 is a first view showing the manner in which a reflecting member is placed according to Embodiment 2 of the present invention.
Figure 12:
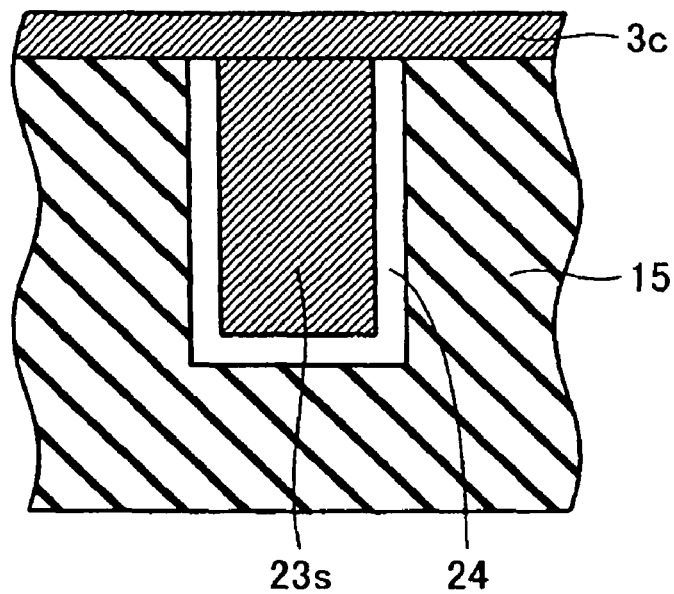
FIG. 12 is a second view showing the manner in which a reflecting member is placed according to Embodiment 2 of the present invention.

In addition, in the structures shown in FIGS. 4 and 6 to 10, reflecting members may be placed inside top plate 15 so as to completely fill in recesses and through holes provided in top plate 15 in such a manner as reflecting member 23*r* shown in FIG. 11, whereas they may be placed so as to leave a gap 24 vis-à-vis the material of top plate 15 without completely filling in the recesses or the through holes in such a manner as reflecting member 23*s* shown in FIG. 12. In addition, the reflecting members are not limited to being solid, but rather may be hollow, as long as they have surfaces on the sides that make contact with the sidewalls of the recesses and the through holes.

It becomes possible to control the energy of high frequency waves stored in each position within top plate 15 more meticulously in the patterns of the arrangements of the reflecting members shown in FIGS. 7 to 10 in the case where the number of reflecting members is increased so that top plate 15 is divided into multiple concentric forms. In addition, though the top plate is divided into concentric forms by reflecting members in any of FIGS. 4 and 6 to 10, the pattern of the arrangement of the reflecting members may be changed so that the top plate is divided into forms other than concentric forms.

Embodiment 3

(Configuration)

Figure 13:
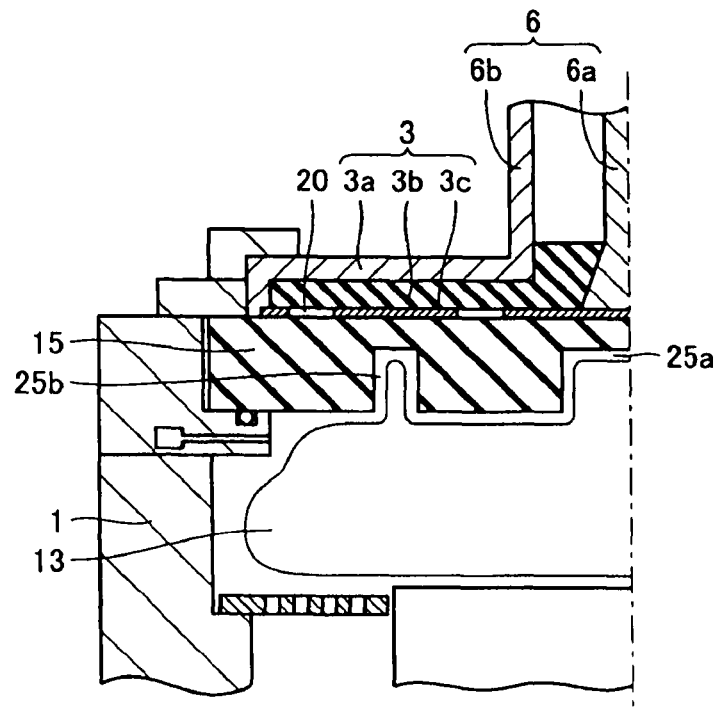
FIG. 13 is a cross sectional view of a portion of the plasma processing apparatus according to Embodiment 3 of the present invention.

With reference to FIG. 13, a plasma processing apparatus according to Embodiment 3 of the present invention will be described. Recesses 25*a* and 25*b* are provided on the surface of top plate 15 on the chamber 1 side in this plasma processing apparatus. Recesses 25*a* and 25*b* open toward the space within chamber 1.

(Working Effects)

In this plasma processing apparatus, plasma 13 enters into the insides of recesses 25*a* and 25*b* when plasma 13 occurs within chamber 1. Plasma 13 in the condition of having a sufficiently high density exists inside recesses 25*a* and 25*b*, and thereby, the high frequency waves that have propagated inside top plate 15 in the lateral direction are reflected at the time when proceeding into the inside of the plasma within recesses 25*a* and 25*b* from the inside of the top plate. That is to say, the structure utilizes the plasma that has entered into the recesses as wave reflecting means.

Figure 14:
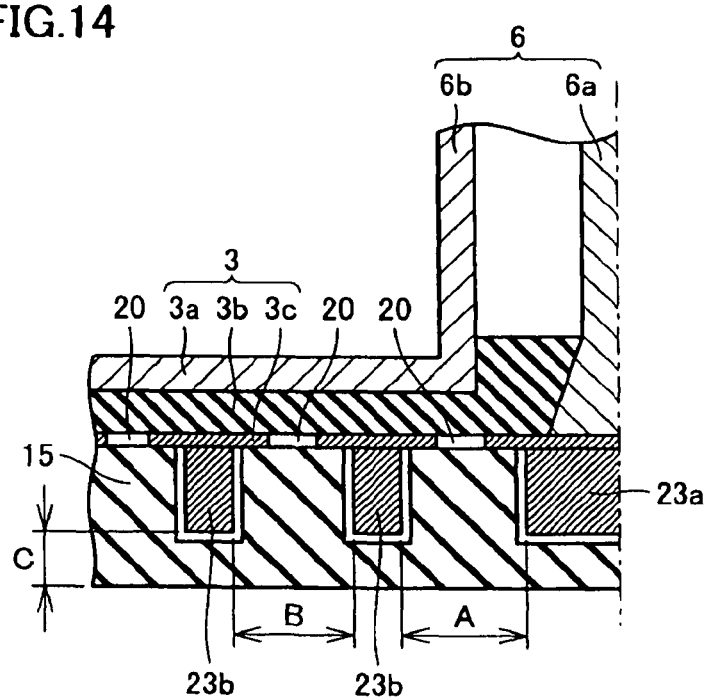
FIG. 14 is a view illustrating the length of each portion of the plasma processing apparatus according to Embodiments 1 to 3 of the present invention.

In each of the above-described embodiments, it is preferable for the length of any portion located between wave reflecting means which are adjacent to each other, that is to say, length A or B in FIG. 14, to be no less than ½ of the wavelength of the high frequency waves when propagating through the material of the top plate. In such a structure, strong standing waves can be generated in the portion located between the wave reflecting means, thus generating a strong electrical field in the vicinity of the plasma within chamber 1, and therefore, the power can be efficiently supplied to the plasma.

In each of the above-described embodiments, it is preferable for length C in FIG. 14, that is to say the thickness of the top plate in the recesses, to be no greater than ½ of the wave length of the high frequency waves when propagating through the material of the top plate. In such a structure, the existence of a recess can prevent standing waves from occurring in a portion where the top plate becomes thin. Accordingly, it becomes possible to independently control the separate conditions of occurrence of standing waves between the adjacent regions divided by the recesses. Furthermore, it is preferable for the thickness of the top plate in a recess to be no greater than ¼ of the wavelength of the high frequency waves when propagating through the material of the top plate. In such a structure, the existence of a recess can prevent without fail the occurrence of standing waves in a portion where the top plate becomes thin.

Embodiment 4

(Configuration)

Figure 15:
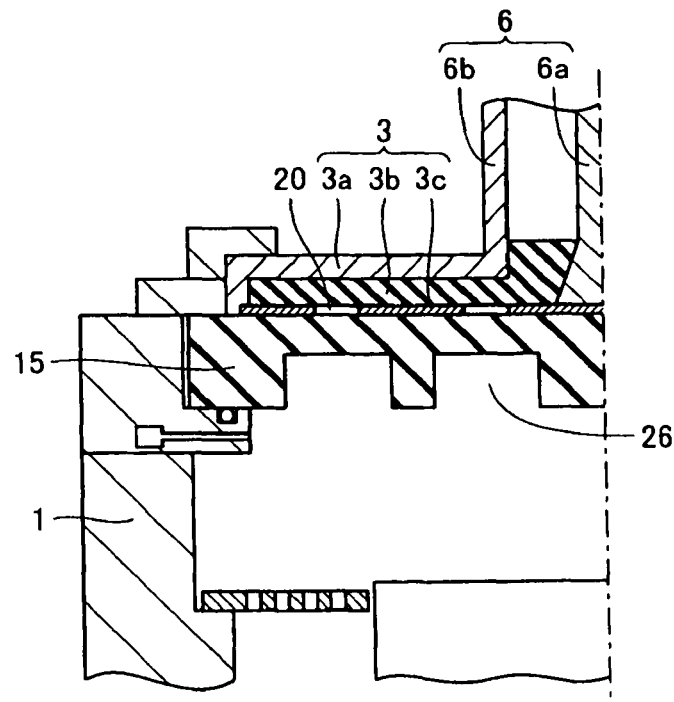
FIG. 15 is a cross sectional view of a portion of the plasma processing apparatus according to Embodiment 4 of the present invention.

With reference to FIG. 15, a plasma processing apparatus according to Embodiment 4 of the present invention will be described. Recesses 26 are located on the lower side surface of top plate 15 in this plasma processing apparatus. Slots 20 are provided in antenna plate 3c so that recesses 26 and slots 20 are located in corresponding positions upward and downward from each other.

Though slots 20 are located so as to correspond to the thick portions of top plate 15 in the plasma processing apparatus (see FIG. 4) according to Embodiment 2, it can be said that slots 20 are located so as to correspond to the thin portions of top plate 15 in the plasma processing apparatus according to Embodiment 4.

(Working Effects)

The high frequency waves that have been released downward from slots 20 are supplied to the thin portions of top plate 15 in this plasma processing apparatus, making it difficult for standing waves to occur within top plate 15. The supplied high frequency waves are not converted to standing waves, but rather, pass through top plate 15 without change so as to be radiated toward the space within chamber 1 via recesses 26. The plasma can enter into the spaces within recesses 26, reducing the distance between slots 20 and the plasma, and thereby, the efficiency of the power supply to the plasma is increased. In addition, top plate 15 has thick portions in addition to thin portions, and thereby, the physical strength of top plate 15 can be sufficiently ensured.

On the other hand, though the distance between the lower surface of top plate 15 and the object to be processed becomes great in portions where top plate 15 becomes thin due to recesses 26, increasing the distance between the plasma generating plane and the object to be processed, and thus slightly reducing the efficiency of plasma processing on the object to be processed, the components of the high frequency waves that move toward the sides from the insides of recesses 26 are reflected from the sidewalls of recesses 26 so as to move downward, thus enhancing the downward directivity of the high frequency waves.

In this plasma processing apparatus, standing waves can be prevented from occurring within the top plate, and the distribution of the degree of supply of high frequency waves to the plasma within the chamber can be set by means of the arrangements of the slots and the recesses, and therefore, a desired plasma distribution can be implemented within the chamber.

Here, Embodiments 2 and 4 are fused into another embodiment, wherein slots 20 are located in antenna plate 3c so as to correspond to both the thick portions and the thin portions of top plate 15. In such a case, the form and the dimensions of each slot can also be appropriately modified so as to adjust the electromagnetic conditions within the top plate to a desired condition.

Embodiment 5

(Configuration)

Figure 16:
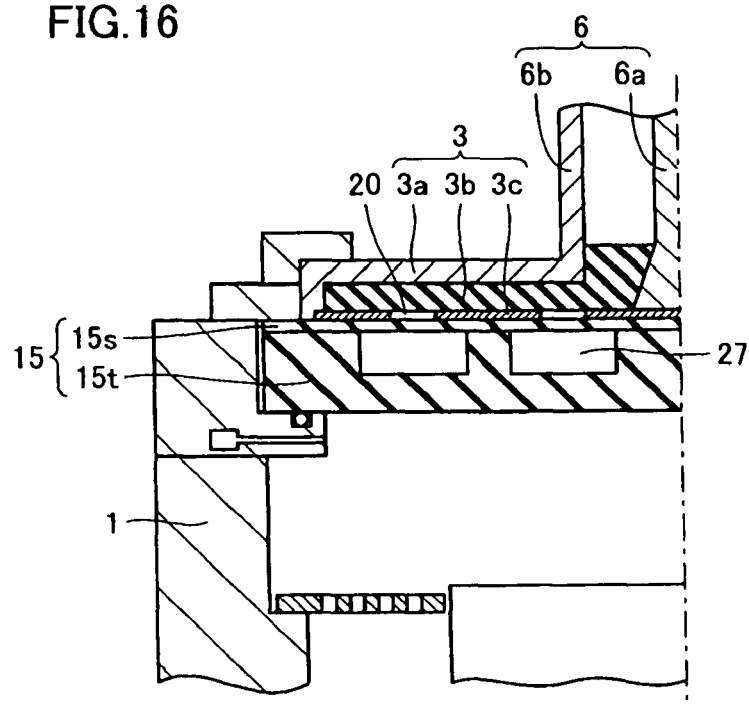
FIG. 16 is a cross sectional view of a portion of the plasma processing apparatus according to Embodiment 5 of the present invention.

With reference to FIG. 16, a plasma processing apparatus according to Embodiment 5 of the present invention will be described. Top plate 15 is formed of two pieces, upper top plate 15s and lower top plate 15t in this plasma processing apparatus. Recesses 27 are arranged in concentric forms on the upper side surface of lower top plate 15t. Slots 20 are provided in antenna plate 3c so that recesses 27 and slots 20 are located in corresponding positions upward and downward from each other. Upper top plate 15s is placed on the upper side of lower top plate 15t, making contact with it so as to cover recesses 27. Upper top plate 15s and lower top plate 15t are made of the same material.

(Working Effects)

Recesses 27 are located directly beneath slots 20 via thin upper top plate 15s in this plasma processing apparatus, and therefore, the high frequency waves which have been radiated downward from slots 20 pass through upper top plate 15s, recesses 27 and lower top plate 15t so as to be directed to the space within chamber 1. Since upper top plate 15s and lower top plate 15t are both thin, it is difficult for the high frequency waves to become standing waves inside top plate 15. In addition, top plate 15 has thick portions in addition to thin portions, and therefore, the physical strength of top plate 15 can sufficiently be ensured. Furthermore, the components of the high frequency waves which are directed toward the sides at the time when passing through recesses 27 are reflected from the sidewalls of recesses 27, and therefore, downward directivity is enhanced. Recesses 27 are provided on the upper side of lower top plate 15t instead of on the side on the chamber 1 side, thus enhancing the directivity without increasing the distance between the plasma generating plane and the object to be processed. As a result, the density of the plasma and of the radicals in the vicinity of the object to be processed can be increased.

Embodiment 6

(Configuration)

Figure 17:
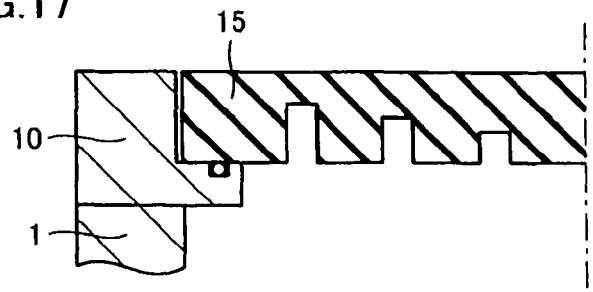
FIG. 17 is a cross sectional view of a portion of the plasma processing apparatus according to Embodiment 5 of the present invention.

With reference to FIG. 17, a plasma processing apparatus according to Embodiment 6 of the present invention will be described. This plasma processing apparatus is basically similar to that described in Embodiment 4 in reference FIG. 15, wherein recesses are arranged in concentric forms on the lower side of top plate 15. However, the depths of the recesses are different from each other. FIG. 17 shows an enlarged view of only the vicinity of top plate 15. The lower surface of top plate 15 is flat, whereas the levels of the bottoms of the recesses are different from each other as a result of the depths of the arranged recesses that are different from each other in this plasma processing apparatus. The rest of the portions of the configuration are the same as those described in Embodiment 4.

(Working Effects)

The same effects as those in Embodiment 4 can also be gained in the present embodiment. That is to say, standing waves can be prevented from occurring in the top plate, and the efficiency of power supply to the plasma can be increased.

Figure 18:
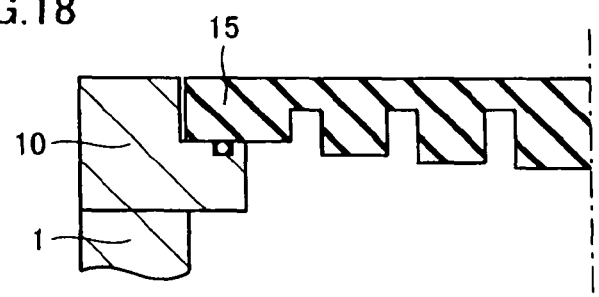
FIG. 18 is a cross sectional view of a portion of a first modification of the plasma processing apparatus according to Embodiment 5 of the present invention.
Figure 19:
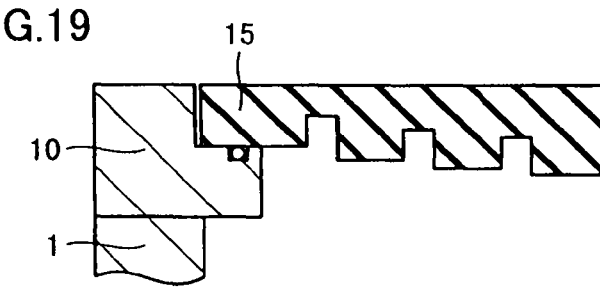
FIG. 19 is a cross sectional view of a portion of a second modification of the plasma processing apparatus according to Embodiment 5 of the present invention.

Furthermore, a structure where the levels of the bottoms of the recesses are the same while the levels of the lower surfaces of top plate 15 vary, as shown in FIG. 18, may be provided as a modification. Furthermore, a structure where the levels of the bottoms of the recesses and the levels of the lower surfaces of top plate 15 both vary, as shown in FIG. 19, may be provided as a modification. Though in the example of FIG. 19 the recesses have an approximately equal depth, while the levels of the lower surfaces of top plate 15 vary, the invention is not limited to cases where the recesses have an approximately equal depth.

As described above, the levels of the bottoms of the recesses and the levels of the lower surfaces of top plate 15 are adjusted in addition to the adjustments of the arrangements of the slots and the recesses, and thereby, the electromagnetic condition within the top plate can be adjusted to a desired condition.

Here, a structure where the top plate has thin portions in positions just under slots may be provided in forms other than those shown in Embodiments 4 to 6, in order to prevent the occurrence of standing waves within the top plate, increasing the downward directivity of the high frequency waves. Accordingly, a desired plasma distribution can be implemented within the chamber.

Figure 20:
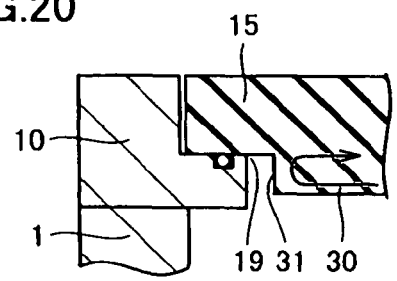
FIG. 20 is a view illustrating the effect of the application of the present invention on the concentration of the electrical field in the contact between the top plate supporting portion and the top plate.
Figure 21:
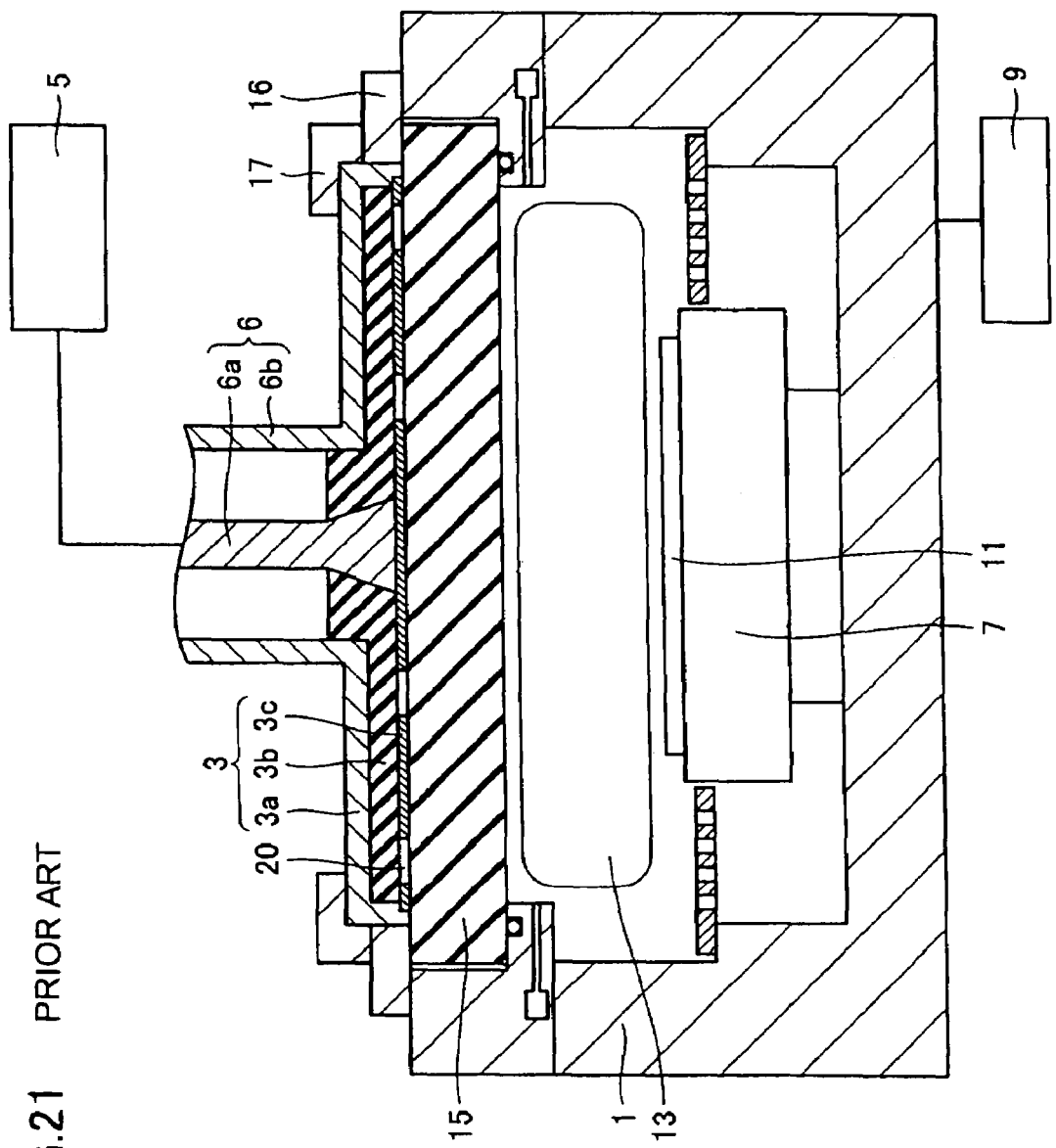
FIG. 21 is a cross sectional view showing a plasma processing apparatus according to the prior art.

Here, in general, the electrical field is concentrated in the vicinity of contact 19 (see FIG. 20) between top plate support 10 which is a member on the chamber 1 side that supports top plate 15 and top plate 15, and in some cases, the material of top plate support 10 is spattered by the plasma, causing a contamination or creating particles. However, in the case where a wave reflecting means is provided within top plate 15 according to the present invention, such a problem can be prevented. In the example shown in FIG. 20, a sidewall 31 is provided as a wave reflecting means so that a portion of microwaves is reflected, as shown by arrow 30, and therefore, the degree of the concentration of the electrical field at contact 19 can be lowered, preventing the situation where top plate support 10 is spattered. This is the effect which is gained by the respective wave reflecting means illustrated in each of the above-described embodiments.

Here, though the reflecting surfaces within the top plate are all provided as vertical surfaces (surfaces perpendicular to the main surface of the top plate) in the examples cited in each of the above descried embodiments, the reflecting surfaces are not limited to those directed in such a manner. For example, the reflecting surfaces may be directed diagonally relative to the main surface of the top plate.

Here, though the expression "high frequency waves" is used in the present specification, high frequency waves include microwaves.

According to the present invention, undesired propagation of high frequency waves can be prevented inside the top plate so that the electromagnetic condition in the top plate can be adjusted to a preferable condition. In particular, propagation of high frequency waves in the radius direction can be prevented, and maldistribution of the intensity of the electrical field in the top plate that occurs between the center portion and the outer peripheral portion can be corrected. As a result, the distribution of the plasma density within the chamber can be made more uniform.

Here, the above-described embodiments, herein disclosed, are illustrated from every viewpoint, and are not limited. The scope of the present invention is defined not by the above description, but rather by the claims, and includes meanings equivalent to the claims and all the modifications within the scope.

Industrial Applicability

The present invention can be applied to a plasma processing apparatus which is used for carrying out plasma processing on a work piece on a manufacturing site or the like of semiconductor devices.

The invention claimed is:

1. A plasma processing apparatus, comprising:
a chamber for carrying out plasma processing inside;
a dielectric plate for sealing an upper side of the chamber;
a high frequency supplying unit for supplying high frequency waves into the chamber via the dielectric plate; and
an antenna plate having a plurality of slots to supply the high frequency waves via the dielectric plate;
wherein:
the dielectric plate has a thick portion and a thin portion and the slots are placed in positions that correspond to the thin portion;
the thin portion has a thickness of no greater than ½ of a wavelength of the high frequency waves when propagating through the dielectric plate; and
the dielectric plate comprises a recess that opens at a surface of the dielectric plate facing the chamber, the recess being provided at a location corresponding to the thin portion.

2. The plasma processing apparatus according to claim 1, wherein the thin portion is located on a side of the dielectric plate that faces the high frequency supplying unit.

3. The plasma processing apparatus according to claim 1, wherein the thin portion has a thickness of no greater than ¼ of the wavelength of the high frequency waves when propagating through the dielectric plate.

4. The plasma processing apparatus according to claim 1, wherein the dielectric plate is segmented.

5. The plasma processing apparatus according to claim 1, wherein the dielectric plate has mutually adjacent thin portions that sandwich a portion of the dielectric plate having a length of at least ½ of the wavelength of the high frequency wave when propagating through the dielectric plate.

6. A plasma processing apparatus comprising:
a chamber for carrying out plasma processing inside;
a dielectric plate for sealing the upper side of said chamber;
a high frequency supplying unit for supplying high frequency waves into the chamber via the dielectric plate; and
an antenna unit having a slot between the dielectric plate and the high frequency supplying unit;
wherein:
the dielectric plate has a thick portion and a thin portion and the slot is placed in a position that corresponds to the thick portion;
the thin portion has a thickness of no greater than ½ of a wavelength of the high frequency waves when propagating through the dielectric plate; and
the dielectric plate comprises a recess that opens at a surface of the dielectric plate facing the chamber, the recess being provided at a location corresponding to the thin portion.

7. The plasma processing apparatus according to claim 6, wherein the thin portion is located on a side of the dielectric plate that faces the high frequency supplying unit.

8. The plasma processing apparatus according to claim 6, wherein the thin portion has a thickness of no greater than ¼ of the wavelength of the high frequency waves when propagating through the dielectric plate.

9. The plasma processing apparatus according to claim 6, wherein the dielectric plate is segmented.

10. The plasma processing apparatus according to claim 6, wherein wherein the dielectric plate has mutually adjacent thin portions that sandwich a portion of the dielectric plate having a length of at least ½ of the wavelength of the high frequency wave when propagating through the dielectric plate.

* * * * *